US010627435B2

(12) United States Patent
Xia et al.

(10) Patent No.: US 10,627,435 B2
(45) Date of Patent: Apr. 21, 2020

(54) METHOD AND APPARATUS FOR MONITORING CAPACITANCE OF DC BUS CAPACITOR

(71) Applicant: Delta Electronics (Shanghai) CO., LTD, Shanghai (CN)

(72) Inventors: Tao Xia, Shanghai (CN); Cheng Lu, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 290 days.

(21) Appl. No.: 15/482,915

(22) Filed: Apr. 10, 2017

(65) Prior Publication Data

US 2018/0156852 A1 Jun. 7, 2018

(30) Foreign Application Priority Data

Dec. 7, 2016 (CN) .......................... 2016 1 1117543

(51) Int. Cl.
G01R 27/26 (2006.01)
H02M 1/12 (2006.01)
G01R 31/02 (2006.01)
(52) U.S. Cl.
CPC ....... G01R 27/2605 (2013.01); G01R 31/028 (2013.01)
(58) Field of Classification Search
CPC .................... G01R 27/2605; G01R 31/028
See application file for complete search history.

(56) References Cited

U.S. PATENT DOCUMENTS

2005/0024028 A1* 2/2005 Ying ................... H02M 3/1584
                                                                323/272
2018/0287390 A1* 10/2018 Nakajima ............... H02J 3/385

FOREIGN PATENT DOCUMENTS

| CN | 202002977 U | 10/2011 |
|----|-------------|---------|
| CN | 103513114 A | 1/2014 |
| CN | 103580495 A | 2/2014 |
| CN | 103580497 A | 2/2014 |
| CN | 103630755 A | 3/2014 |
| CN | 103795284 A | 5/2014 |
| CN | 103580497 B | 11/2015 |

(Continued)

OTHER PUBLICATIONS

The CN1OA dated Oct. 25, 2019 by the CNIPA.

*Primary Examiner* — Regis J Betsch
*Assistant Examiner* — Jeremy A Delozier
(74) *Attorney, Agent, or Firm* — Yunling Ren

(57) ABSTRACT

A method for monitoring capacitance of DC bus capacitor of a power electronic converter is provided, wherein the power electronic converter includes at least one AC/DC conversion circuit and the DC bus capacitor, a power input/output interface of the AC/DC conversion circuit including a first terminal and a second terminal. The first terminal is connected to an AC grid with a frequency of f, the second terminal is connected to the DC bus capacitor, f is any positive real number, and the method includes: measuring a pulsating power with a frequency of 2f flowing through the DC bus capacitor and a voltage on the DC bus capacitor; and calculating the capacitance of the DC bus capacitor based on the pulsating power and the voltage on the DC bus capacitor. An apparatus for monitoring the capacitance of the DC bus capacitor is provided correspondingly.

12 Claims, 25 Drawing Sheets

(56) References Cited

FOREIGN PATENT DOCUMENTS

| CN | 105978370 | A | 9/2016 |
|----|-----------|---|--------|
| JP | 5359282 | B2 | 12/2013 |
| TW | I297235 | B | 5/2008 |

\* cited by examiner

Parameter measuring step, wherein the pulsating power includes a pulsating power magnitude, by measuring an AC current flowing through the first terminal, the pulsating power magnitude is:

$\|(I_g * D * V_c)\_{2f}\|$, wherein $(\ )\_{2f}$ denotes the second-order component and $\|\ \|$ denotes a magnitude calculation operation, $I_g$ is the AC current flowing through the first terminal, D is a duty ratio of the AC/DC conversion circuit and $V_c$ is the voltage on the DC bus capacitor

100'''

↓

Capacitance calculating step — 110

Fig.8

Parameter measuring step, wherein the pulsating power includes a pulsating power magnitude, the voltage on the DC bus capacitor includes a maximum value of the voltage on the DC bus capacitor, a minimum value of the voltage on the DC bus capacitor and an average value of the voltage on the DC bus capacitor, by measuring a power input to a DC bus and a power output from a DC bus, the pulsating power magnitude $P_{mag}$ is determined as calculating a magnitude of a difference between the power input to the DC bus and the power output from the DC bus — 100'''''

Capacitance calculating step, the capacitance of the DC bus capacitor is:
$P_{mag}/(2*\pi*f*(V_{cmax}-V_{cmin})*V_{cmean})$,
wherein $P_{mag}$ is the pulsating power magnitude, $V_{cmax}$ is the maximum value of the voltage on the DC bus capacitor, $V_{cmin}$ is the minimum value of the voltage on the DC bus capacitor, and $V_{cmean}$ is the average value of the voltage on the DC bus capacitor — 110'

Fig.10

Parameter measuring step, wherein the pulsating power includes a pulsating power magnitude, by measuring an AC current flowing through the first terminal, a current flowing through the fourth terminal and a voltage on the fourth terminal, the pulsating power magnitude $P_{mag}$ is:
$$\|(I_g * D * V_c - I_o * V_o)\_{2f}\|,$$
wherein $(\ )\_{2f}$ denotes the second-order component and $\|\ \|$ denotes a magnitude calculation operation, $I_g$ is the AC current flowing through the first terminal, $D$ is a duty ratio of the AC/DC conversion circuit, $V_c$ is the voltage on the DC bus capacitor, $I_o$ is the current flowing through the fourth terminal and $V_o$ is the voltage on the fourth terminal

100'''''''

Capacitance calculating step, the capacitance of the DC bus capacitor is:
$$P_{mag}/(2*\pi*f*(V_{cmax} - V_{cmin})*V_{cmean}),$$
wherein $P_{mag}$ is a pulsating power magnitude, $V_{cmax}$ is the maximum value of the voltage on the DC bus capacitor, $V_{cmin}$ is the minimum value of the voltage on the DC bus capacitor, and $V_{cmean}$ is the average value of the voltage on the DC bus capacitor

Parameter measuring step, wherein the pulsating power includes a pulsating power magnitude, by measuring an AC current flowing through the first terminal, the pulsating power magnitude $P_{mag}$ is:
$$\|(I_g*D*V_c)\_{2f}\|,$$
wherein $(\ )\_{2f}$ denotes the second-order component and $\|\ \|$ denotes a magnitude calculation operation, $I_g$ is the AC current flowing through the first terminal, D is a duty ratio of the AC/DC conversion circuit and $V_c$ is the voltage on the DC bus capacitor

100''''''''

Capacitance calculating step, the capacitance of the DC bus capacitor is:
$$P_{mag}/(2*\pi*f*(V_{cmax}-V_{cmin})*V_{cmean}),$$
wherein $P_{mag}$ is the pulsating power magnitude, $V_{cmax}$ is the maximum value of the voltage on the DC bus capacitor, $V_{cmin}$ is the minimum value of the voltage on the DC bus capacitor, and $V_{cmean}$ is the average value of the voltage on the DC bus capacitor

METHOD AND APPARATUS FOR MONITORING CAPACITANCE OF DC BUS CAPACITOR

CROSS REFERENCE

This application is based upon and claims priority to Chinese Patent Application No. 201611117543.7, filed on Dec. 7, 2016, the entire contents thereof are incorporated herein by reference.

TECHNICAL FIELD

The present disclosure generally relates to a field of power electronic technology, and more particularly, to a method for monitoring a capacitance of a DC (Direct Current) bus capacitor of a power electronic converter and an apparatus for monitoring a capacitance of a DC bus capacitor of a power electronic converter, using this method.

BACKGROUND

In a power electronic system, a DC bus capacitor is needed to be connected across the DC bus of the power electronic system to store energy. Usually, an electrolytic capacitor with large capacity and high voltage endurance is used as a DC bus capacitor, to store a large amount of energy. However, the electrolytic capacitor is subject to aging or even failure, thus causing system performance degradation or breakdown.

For example, FIG. 1 is a schematic diagram of a power electronic converter module 1000 in a phase of a power electronic transformer (PET) in the prior art. The power electronic converter module 1000 includes an AC (Alternative Current)/DC conversion circuit (AC/DC) 1 and a DC/DC conversion circuit (DC/DC) 2. The AC/DC 1 and DC/DC 2 are cascaded through a DC bus B. A DC bus capacitor C is connected in parallel with the DC bus B. The power electronic converter module 1000 has an input terminal, i.e., an input terminal $T_{in}$ of the AC/DC 1, and an output terminal, i.e., an output terminal $T_{out}$ of the DC/DC 2. The input terminal $T_{in}$ may be connected to an AC power source, such as an AC power grid, a wind turbine, etc., to input an AC voltage $V_i$ with a frequency f, wherein f is any positive real number. The output terminal $T_{out}$ may output a DC voltage $V_o$ to a load. During operation of the power electronic converter module 1000, since both the capacity of the AC/DC 1 and the capacitance of the DC bus capacitor C are limited, the voltage on the DC bus capacitor C is typically a pulsating DC voltage, where the frequency of the main pulsating component is 2f (i.e., two times of f), which is particularly disadvantageous to the life expectancy of the electrolytic capacitor.

Therefore, in order to avoid decline of reliability of a power electronic system due to failure and aging of the electrolytic capacitor, the capacitance of the DC bus capacitor needs to be monitored to predict which DC bus capacitor is about to fail, so as to take appropriate measures in advance.

In the authorization bulletin No. CN103580497B, the capacitance prediction value of the DC bus capacitor is corrected by a closed loop, and the corrected capacitance is substituted into a capacitance voltage dynamic equation to predict the current voltage of the DC bus capacitor. When a voltage prediction value and a measured value of the DC bus capacitor are the same, the corrected value of the capacitance at this time is considered to be the same as the actual value. In such a way to predict the capacitance of the DC bus capacitor, difference between the voltage prediction value and the measured value of the DC bus capacitor will simultaneously affect the input power prediction value and the capacitance prediction of the DC bus capacitor, which may affect the accuracy of capacitance estimation.

In the authorization bulletin CN103795284A, a single module of inverter to be measured in cascaded inverters is selected through a selection signal. The phase of its output voltage is modified to have a phase difference of 90° with its load current. Output voltages of remaining inverters of the same phase are adjusted at the same time, such that the total output voltage of the phases remains unchanged. The power of the DC bus capacitor of the module to be measured only has an AC component. The capacitance of the DC bus capacitor of the module to be measured may be estimated by using a quantitative relationship between peak to peak value of the fluctuating voltage of the DC bus capacitor and an AC power component of the second-order harmonic frequency. However, this way needs to change the normal operation mode, and a reference voltage of the module to be measured needs to be set separately.

SUMMARY

The present disclosure aims to provide a method for monitoring a capacitance of a DC bus capacitor of a power electronic converter and an apparatus for monitoring a capacitance of a DC bus capacitor of a power electronic converter, using this method, so as to overcome one or more problems resulting from limitation and defects of related technologies at least to a certain degree.

The other characteristics and advantages of the present disclosure may become apparent from the following detailed description, or be partly learned from the practice of the present disclosure.

According to one aspect of the present disclosure, a method is provided to monitor capacitance of a DC bus capacitor of a power electronic converter, wherein the power electronic converter includes at least one AC/DC conversion circuit and the DC bus capacitor, a power input/output interface of the AC/DC conversion circuit including a first terminal and a second terminal. The first terminal is connected to an AC grid with a frequency of f, the second terminal is connected to the DC bus capacitor, f is any positive real number, and the method includes:

a parameter measuring step, measuring a pulsating power with a frequency of 2f flowing through the DC bus capacitor and a voltage on the DC bus capacitor; and a capacitance calculating step, calculating the capacitance of the DC bus capacitor based on the pulsating power and the voltage on the DC bus capacitor.

According to another aspect of the present disclosure, an apparatus is provided to monitor a capacitance of a DC bus capacitor of a power electronic converter, wherein the power electronic converter includes at least one AC/DC conversion circuit and the DC bus capacitor, a power input/output interface of the AC/DC conversion circuit including a first terminal and a second terminal. The first terminal is connected to an AC grid with a frequency of f, the second terminal is connected to the DC bus capacitor, f is any positive real number, and the apparatus includes:

a parameter measuring circuit, including:

a pulsating power measuring circuit, configured to measure a pulsating power with a frequency of 2f flowing through the DC bus capacitor; and a voltage measuring circuit, configured to measure a voltage on the DC bus capacitor; and a capacitance calculating circuit, configured to calculate the capacitance of the DC bus capacitor based on the pulsating power and the voltage on the DC bus capacitor.

Through the method and apparatus for monitoring capacitance of a DC bus capacitor of a power electronic converter of the present disclosure, signals capable of reflecting a power on an AC side of the power electronic converter, signals capable of reflecting a power on a DC side of the power electronic converter and a voltage of the DC bus capacitor are received, to obtain a pulsating power and a pulsating voltage flowing through the DC bus capacitor and calculate the capacitance thereof in an open loop mode.

Through the method and apparatus for monitoring capacitance of a DC bus capacitor of a power electronic converter according to the present disclosure, no additional hardware sampling and control circuit need to be added; the open loop estimation manner is simple and reliable, which avoids the stability problem brought by two feedback circuits in the prior art; the existing control architecture is not affected, which avoids the problem that the duty cycles of other modules need to be adjusted based on the output of the measured module in the existing technology scheme. It is more convenient to embed the apparatus into an existing control system as a separate functional module; and all DC bus capacitors in the power electronic converter modules may be estimated at the same time, and there is no need to specify a module to be measured by a selection signal.

For the purpose of further understanding the features and technical contents of the present disclosure, reference is made to the following detailed description and the accompanying drawings of the present disclosure. However, the detailed description and accompanying drawings herein are intended to be illustrative of the present disclosure and are not intended to make any restrictions on the scope of the claims of the present disclosure.

BRIEF DESCRIPTION OF THE DRAWINGS

The above and other features and advantages of the present disclosure will become more apparent by describing its exemplary embodiments in detail with reference to the accompanying drawings.

FIG. 8 is a flow chart of another embodiment of a method for monitoring a capacitance of a DC bus capacitor of a power electronic converter of the present disclosure;

FIG. 10 is a flow chart of another embodiment of a method for monitoring a capacitance of a DC bus capacitor of a power electronic converter of the present disclosure;

FIG. 11 is a flow chart of another embodiment of a method for monitoring a capacitance of a DC bus capacitor of a power electronic converter of the present disclosure;

FIG. 12 is a flow chart of another embodiment of a method for monitoring a capacitance of a DC bus capacitor of a power electronic converter of the present disclosure;

DETAILED DESCRIPTION

Figure 1:
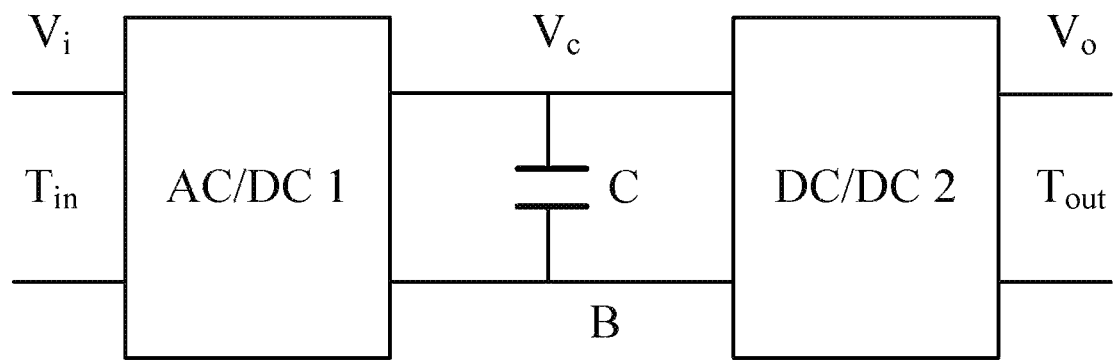
FIG. 1 is a schematic diagram of a power electronic converter module 1000 in a phase of a PET in the prior art.

Exemplary embodiments will now be described more fully with reference to the drawings. The exemplary embodiments, however, may be implemented in various forms, and should not be construed as been limited to the implementations set forth herein; instead, the implementations are provided such that the present disclosure will be through and complete, and will fully convey the concept of exemplary embodiments to those skilled in the art. In the drawings, the same reference signs denote the same or similar structures, thus their detailed description will be omitted.

In addition, the features, structures or characteristics described herein can be combined in one or more embodiments in any appropriate way. In the description hereinafter, many specific details are provided for fully understanding of the embodiments of the present disclosure. However, it will be appreciated by those skilled in the art that the technical solution of the present disclosure can be practiced without one or more of the specific details, or with other structures, components, steps or methods, etc. In addition, known structures, components or operations will not be illustrated or described in detail, to avoid obscuration of the aspects of the present disclosure.

Firstly, one embodiment of a method for monitoring a capacitance of a DC bus capacitor of a power electronic converter is described with reference to FIGS. 2 and 3.

Figure 2:
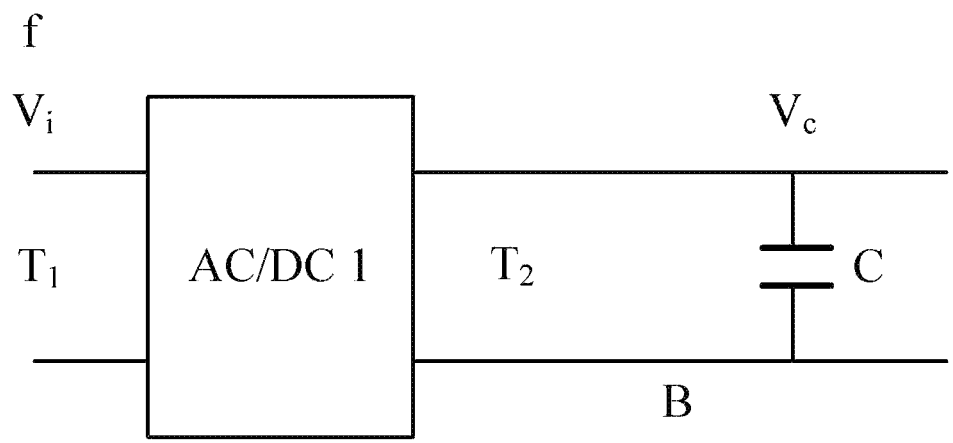
FIG. 2 is a schematic diagram of a power electronic converter module 1001 in the prior art.

FIG. 2 is a schematic diagram of a power electronic converter module 1001 in the prior art. The circuit structure of the power electronic converter module 1001 in FIG. 2 is simpler than that of FIG. 1, in order to understand the present disclosure more easily.

As shown in FIG. 2, the power electronic converter 1001 includes at least one AC/DC 1 and a DC bus capacitor C. The AC/DC 1 and the DC bus capacitor C are connected through a DC bus B. A power input/output interface of the AC/DC 1 includes a first terminal $T_1$ and a second terminal $T_2$. The first terminal $T_1$ may be connected to an AC power source, to input or output an AC voltage $V_i$ with a frequency of f, wherein f is any positive real number. The second terminal $T_2$ is connected in parallel to the DC bus capacitor C through a DC bus B, for charging or discharging the DC bus capacitor C, such that the DC bus capacitor C has a voltage Vc.

For example, if the DC bus B has an external DC load, the structure as shown in FIG. 2 may be looked as a part of the power electronic converter module 1000 in FIG. 1, which only omits the DC/DC 2.

For another example, if the second terminal $T_2$ is only connected in parallel to the DC bus capacitor C through the DC bus B and the DC bus B is no longer connected to any external load, the DC bus capacitor C connected in this way is referred to as a floating capacitor. Herein, the second terminal $T_2$ may either charge the DC bus capacitor C or extract energy from the DC bus capacitor C. That is, the AC/DC 1 may be used bidirectionally, either serving as a rectifier or as an inverter, such that the power electronic converter 1001 may function as a static var generator (SVG).

Figure 3:
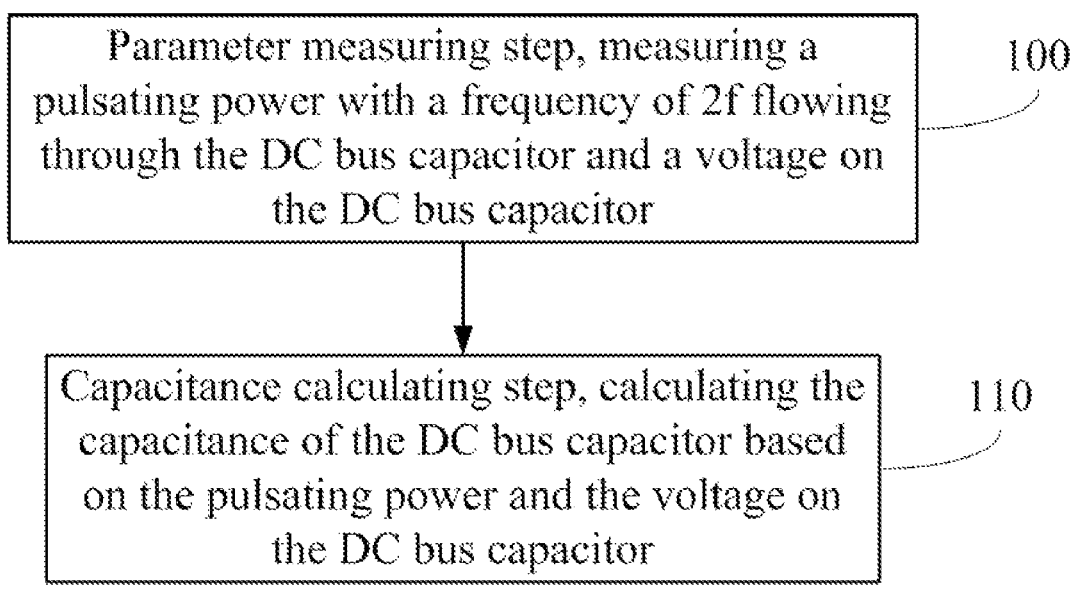
FIG. 3 is a flow chart of one embodiment of a method for monitoring a capacitance of a DC bus capacitor of a power electronic converter of the present disclosure.

FIG. 3 is a flow chart of an embodiment of a method for monitoring capacitance of a DC bus capacitor of a power electronic converter of the present disclosure, for illustrating the method for determining capacitance of a DC bus capacitor C of a power electronic converter 1001 as shown in FIG. 2.

As shown in FIG. 3, the method of the present embodiment includes a parameter measuring step 100 and a capacitance calculating step 110.

In the parameter measuring step 100, a pulsating power $P_{c\_2f}$ with a frequency of 2f (i.e., two times of f) flowing through the DC bus capacitor C and a voltage $V_c$ on the DC bus capacitor are measured.

In the capacitance calculating step 110, the capacitance of the DC bus capacitor C is calculated based on the pulsating power $P_{c\_2f}$ and the voltage $V_c$ on the DC bus capacitor.

In one embodiment, the pulsating power $P_{c\_2f}$ is measured by filtering a power on the DC bus capacitor Pc through a second-order filter.

Hereinafter, by ignoring the line loss, approximating a power $P_{cin}$ input to the DC bus capacitor C as a power $P_{in}$ input to a DC bus B, and approximating a power $P_{cout}$ output from the DC bus capacitor C as a power $P_{out}$ output from a DC bus B, the present disclosure provides more specific embodiments of a method for monitoring capacitance of the DC bus capacitor of a power electronic converter.

Figure 4:
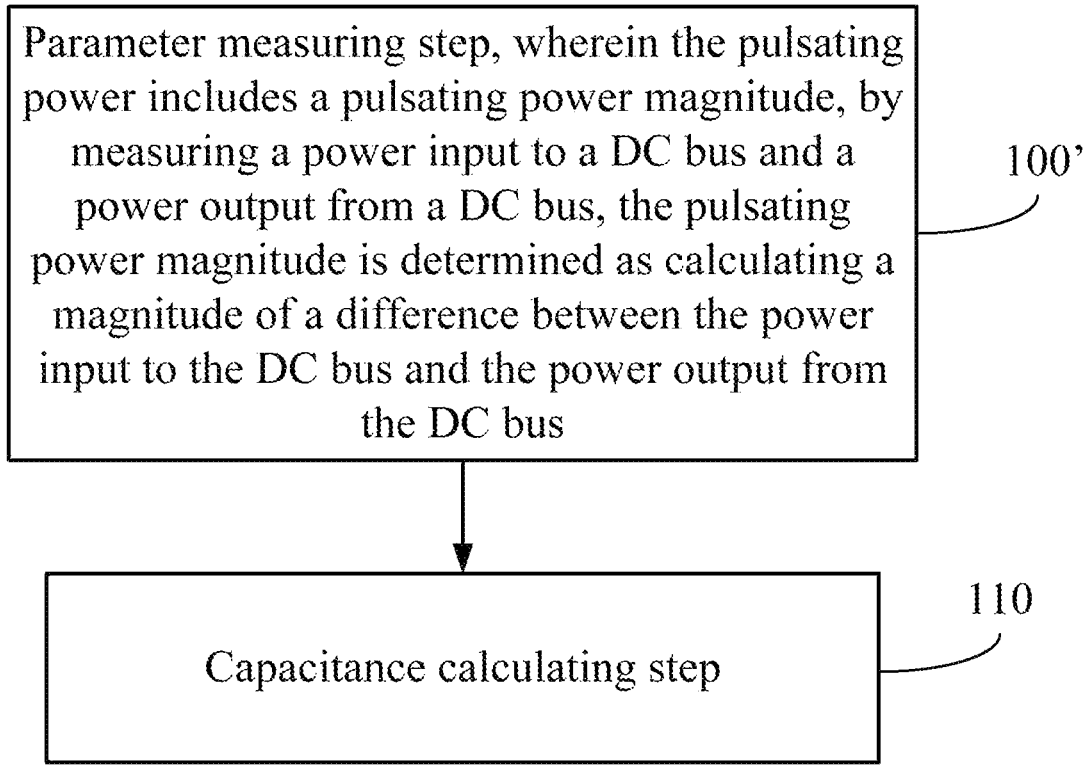
FIG. 4 is a flow chart of another embodiment of a method for monitoring a capacitance of a DC bus capacitor of a power electronic converter of the present disclosure.

FIG. 4 is a flow chart of another embodiment of a method for monitoring the capacitance of a DC bus capacitor of a power electronic converter of the present disclosure for illustrating the method for determining a capacitance of a DC bus capacitor C of a power electronic converter 1001 as shown in FIG. 2.

As shown in FIG. 4, the method of the present embodiment includes a parameter measuring step 100' and a capacitance calculating step 110. Since the pulsating power $P_{c\_2f}$ through the DC bus capacitor C is pulsating, it has a pulsating power magnitude $P_{mag}$. The present embodiment determines the capacitance of the DC bus capacitor C through the pulsating power magnitude $P_{mag}$.

In the parameter measuring step 100', by measuring the power $P_{in}$ input to the DC bus B and the power $P_{out}$ output from the DC bus B in the above parameter measuring step 100, the pulsating power magnitude $P_{mag}$ is determined by calculating the magnitude of difference between the power $P_{in}$ input to the DC bus B and the power $P_{out}$ output from the DC bus B. The pulsating power magnitude $P_{mag}$ is:

$$P_{mag} = \|P_{c\_2f}\| = \|(P_{in} - P_{out})_{\_2f}\|$$

Wherein $(\ )_{\_2f}$ denotes a second-order component, and $\|\ \|$ represents a magnitude calculation operation.

The capacitance calculating step 110 is the same as that described above, which will not be repeated.

How to measure the power $P_{in}$ input to the DC bus B and the power $P_{out}$ output from the DC bus B is not limited by the present embodiment.

Another embodiment of a method for monitoring a capacitance of a DC bus capacitor of a power electronic converter of the present disclosure is described below with reference to FIGS. 5 and 6.

Figure 5:
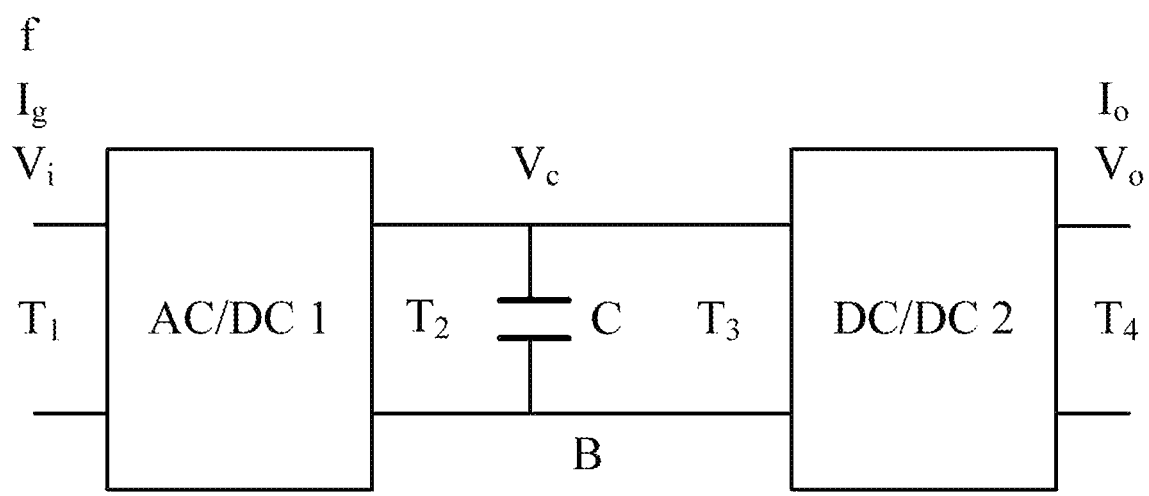
FIG. 5 is a schematic diagram of a power electronic converter module 1002 in the prior art.

FIG. 5 is a schematic diagram of a power electronic converter module 1002 in the prior art. The circuit configuration of the power electronic converter module 1002 in FIG. 5 is the same as that of FIG. 1, which may also be a power electronic converter module in one phase of the PET, for example.

A DC/DC 2 is added in FIG. 5 on the basis of FIG. 2. A power input/output interface of the DC/DC 2 includes a third terminal $T_3$ and a fourth terminal $T_4$. The third terminal $T_3$ is connected in parallel to the DC bus capacitor C. Assume that duty cycle of the AC/DC 1 is D, voltage on the DC bus capacitor C is $V_c$, current flowing through the first terminal $T_1$ is $I_g$, voltage on the fourth terminal $T_4$ is $V_o$, and DC current $I_o$ flows through the fourth terminal $T_4$.

Figure 6:
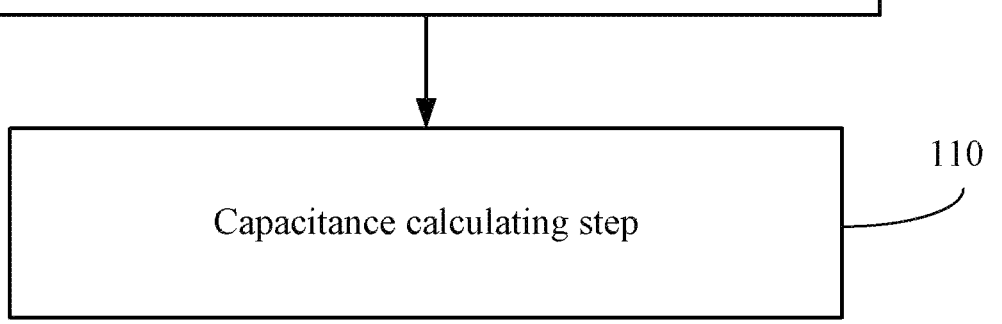
FIG. 6 is a flow chart of another embodiment of a method for monitoring a capacitance of a DC bus capacitor of a power electronic converter of the present disclosure.

FIG. 6 is a flow chart of another embodiment of a method for monitoring a capacitance of a DC bus capacitor of a power electronic converter of the present disclosure, for illustrating the method of determining capacitance of the DC bus capacitor C of a power electronic converter 1002 as shown in FIG. 5.

The present embodiment ignores the loss of the AC/DC and DC/DC circuits, approximates the power $P_{in}$ input to the DC bus B as a power $P_{a2d}$ at the first terminal $T_1$ of the AC/DC, and approximates the power $P_{out}$ output from the DC bus B as a power $P_{d2d}$ output from the fourth terminal $T_4$ of the DC/DC.

As shown in FIG. 6, the method of the present embodiment includes a parameter measuring step 100" and a capacitance calculating step 110.

Since the power $P_{a2d}$ at the first terminal $T_1$ is
$I_g*D*V_c$, and
the power $P_{d2d}$ at the fourth terminal $T_4$ is
$I_o*V_o$, in the parameter measuring step 100", by measuring an AC current $I_g$ flowing through the first terminal $T_1$, a voltage $V_c$ on the DC bus capacitor C, a current $I_o$ flowing through the fourth terminal $T_4$ and a voltage $V_o$ on the fourth terminal in the above parameter measuring step 100, the pulsating power magnitude $P_{mag}$ is:

$$P_{mag} = \|P_{c\_2f}\| = \|(P_{in} - P_{out})_{\_2f}\| = \|(P_{a2d} - P_{d2d})_{\_2f}\| = \|(I_g * D * V_c - I_o * V_o)_{\_2f}\|,$$

The capacitance calculating step 110 is the same as that described above, which will not be repeated.

How to measure the voltage $V_c$ on the DC bus capacitor C, the current $I_g$ flowing through the first terminal $T_1$, the voltage $V_o$ on the fourth terminal $T_4$ and the DC current $I_o$ flowing through the fourth terminal $T_4$ is not limited by the present embodiment.

Another embodiment of a method for monitoring a capacitance of a DC bus capacitor of a power electronic converter of the present disclosure is described below with reference to FIGS. 7 and 8.

Figure 7:
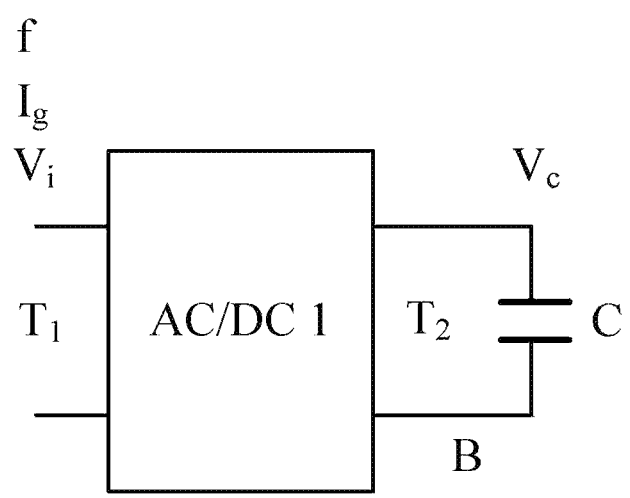
FIG. 7 is a schematic diagram of a power electronic converter module 1003 in the prior art.

FIG. 7 is a schematic diagram of a power electronic converter module 1003 in the prior art. The circuit configuration of the power electronic converter module 1003 in FIG. 7 is the same as that of FIG. 2, which may also be a power electronic converter module in one phase of the SVG, for example.

The DC/DC 2 is omitted in FIG. 7 on the basis of FIG. 5, and the DC bus capacitor C is provided as a floating capacitor.

FIG. 8 is a flow chart of another embodiment of a method for monitoring capacitance of a DC bus capacitor of a power electronic converter of the present disclosure, for illustrating the method for determining capacitance of a DC bus capacitor C of a power electronic converter 1003 as shown in FIG. 7.

As shown in FIG. 8, the method of the present embodiment includes a parameter measuring step 100''' and a capacitance calculating step 110.

In the parameter measuring step 100''', by measuring an AC current $I_g$ flowing through the first terminal $T_1$ and a voltage $V_c$ on the DC bus capacitor C in the above parameter measuring step 100, the pulsating power magnitude $P_{mag}$ is:

$$P_{mag} = \|P_{c\_2f}\| = \|(P_{in} - P_{out})_{\_2f}\| = \|(P_{a2d} - 0)_{\_2f}\| = \|(I_g * D * V_c)_{\_2f}\|$$

That is to say, although the DC/DC2 in FIG. 5 is removed, the formula for determining the capacitance power magnitude $P_{mag}$ as shown in FIG. 6 is still applicable.

The capacitance calculating step 110 is the same as that described above, which will not be repeated.

How to measure the voltage $V_c$ on the DC bus capacitor C and the current $I_g$ flowing through the first terminal $T_1$ is not limited by the present embodiment.

Figure 9:
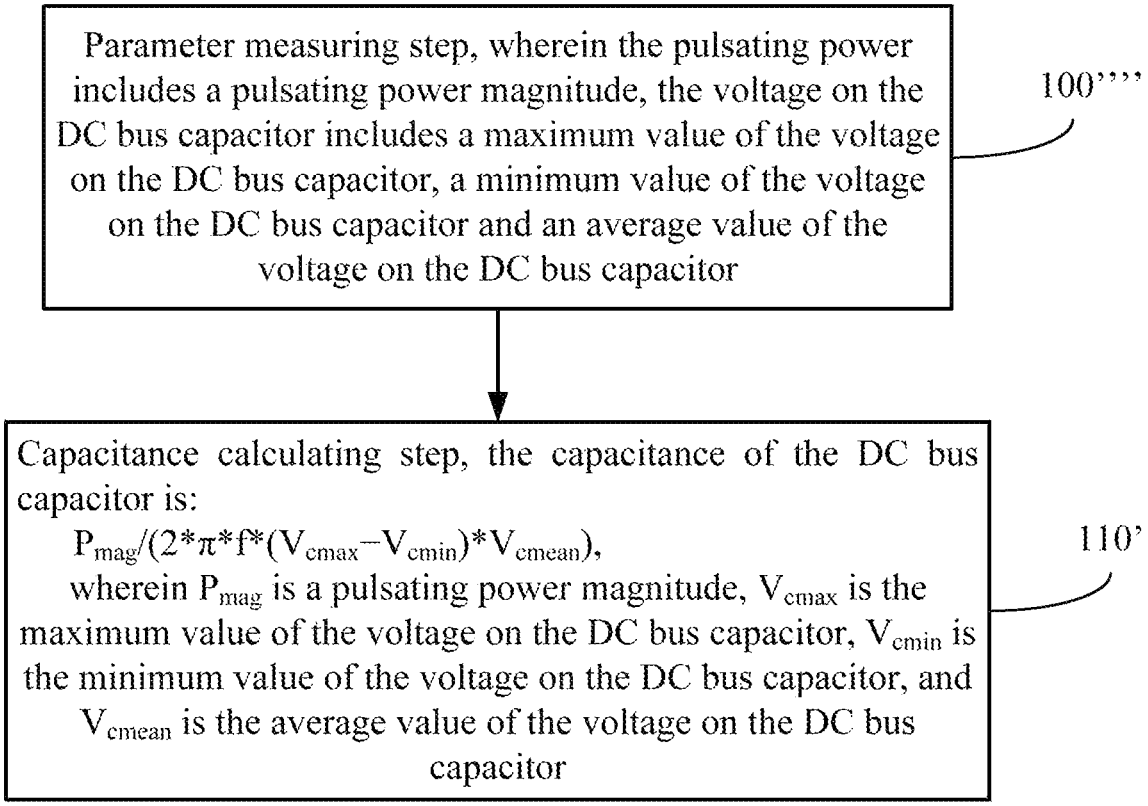
FIG. 9 is a flow chart of another embodiment of a method for monitoring a capacitance of a DC bus capacitor of a power electronic converter of the present disclosure.
Figure 24:
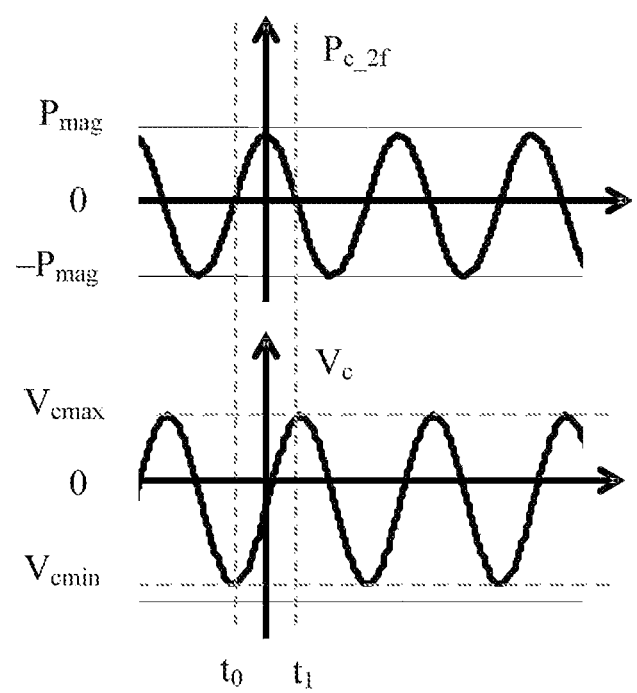
FIG. 24 is a schematic diagram illustrating how the pulsating power $P_{c\_2f}$ and the voltage $V_c$ on the DC bus capacitor C change.

FIG. 9 is a flow chart of another embodiment of a method for monitoring the capacitance of a DC bus capacitor of a power electronic converter of the present disclosure, for further illustrating the method of determining capacitance of the DC bus capacitor C of a power electronic converter 1001 as shown in FIG. 2. FIG. 24 is a schematic diagram illustrating the relationship between the pulsating power $P_{c\_2f}$ and the voltage $V_c$ on the DC bus capacitor C.

Since the DC component of the pulsating power may be assumed as zero and higher order harmonics may be ignored, a 2f frequency (i.e., two times of f, a second-order harmonic frequency) component (i.e., a second-order component) is considered, and the aforementioned pulsating power $P_{c\_2f}$ may also be expressed as:

$$P_{c\_2f} = P_{mag} * \cos(2*\pi*f*t + \gamma)$$

wherein $P_{mag}$ is the aforementioned pulsating power magnitude, cos( ) is a cosine function, f is the frequency of the aforementioned AC power source, t is time, and $\gamma$ is an initial phase angle.

Referring to FIG. 24, between an adjacent valley and peak of the 2f component of the voltage $V_c$ on the DC bus capacitor C, i.e., during an integration interval $(t_0, t_1)$ in FIG. 24, integrate $P_{c\_2f}/V_c$ with respect to time, then:

$$V_{cmax} = V_{cmin} + \frac{\int_{t_0}^{t_1} \frac{p_{c\_2f}}{v_c} dt}{C_{est}}$$

wherein $V_{cmax}$ is the maximum value of the voltage on the DC bus capacitor C, $V_{cmin}$ is the minimum value of the voltage on the DC bus capacitor, and $C_{est}$ is the capacitance of the DC bus capacitor C.

Further substitution is preformed, then:

$$V_{cmax} - V_{cmin} = \frac{\int_{t_0}^{t_1} \frac{p_{c\_2f}}{v_c} dt}{C_{est}} = \frac{\int_{-T/8}^{T/8} \frac{p_{mag} \cos(2\pi ft)}{v_c} dt}{C_{est}},$$

wherein T=1/f.

To simplify the integration process, $V_c$ is approximated as an average value $V_{cmean}$ of the voltage on the DC bus capacitor C in the present disclosure, so that the capacitance of the DC bus capacitor C is obtained as:

$$P_{mag}/(2*\pi*f*(V_{cmax}-V_{cmin})*V_{cmean}).$$

Based on the above approximation, as shown in FIG. 9, the method of the present embodiment includes a parameter measuring step 100'''' and a capacitance calculating step 110'.

In the parameter measuring step 100'''', the voltage $V_c$ on the DC bus capacitor C in the above parameter measuring step 100 includes the maximum value $V_{cmax}$ of the voltage on the DC bus capacitor C, the minimum value $V_{cmin}$ of the voltage on the DC bus capacitor and the average value $V_{cmean}$ of the voltage on the DC bus capacitor.

In the calculating step 110', the capacitance of the DC bus capacitor C is:

$$P_{mag}/(2*\pi*f*(V_{cmax}-V_{cmin})*V_{cmean}).$$

How to measure the pulsating power magnitude $P_{mag}$ on the DC bus capacitor C, the maximum value $V_{cmax}$ of the voltage on the DC bus capacitor C, the minimum value $V_{cmin}$ of the voltage on the DC bus capacitor and the average value $V_{cmean}$ of the voltage on the DC bus capacitor is not limited by the present embodiment.

FIG. 10 is a flow chart of another embodiment of a method for monitoring a capacitance of a DC bus capacitor of a power electronic converter of the present disclosure, for further illustrating the method for determining a capacitance of a DC bus capacitor C of a power electronic converter 1001 as shown in FIG. 2.

As shown in FIG. 10, the method of the present embodiment includes a parameter measuring step 100''''' and a capacitance calculating step 110'.

In the parameter measuring step 100''''', the voltage $V_c$ on the DC bus capacitor C in the above parameter measuring step 100 include the maximum value $V_{cmax}$ of the voltage on the DC bus capacitor C, the minimum value $V_{cmin}$ of the voltage on the DC bus capacitor and the average value $V_{cmean}$ of the voltage on the DC bus capacitor. By measuring the power $P_{in}$ input to the DC bus B and the power $P_{out}$ output from the DC bus B, the pulsating power magnitude $P_{mag}$ is determined as calculating the magnitude of difference between the power $P_{in}$ input to the DC bus B and the power $P_{out}$ output from the DC bus.

The capacitance calculating step 110' is the same as that described above, which will not be repeated.

How to measure the pulsating power magnitude $P_{mag}$ on the DC bus capacitor C, the maximum value $V_{cmax}$ of the voltage on the DC bus capacitor C, the minimum value $V_{cmin}$ of the voltage on the DC bus capacitor and the average value $V_{cmean}$ of the voltage on the DC bus capacitor is not limited by the present embodiment.

FIG. 11 is a flow chart of another embodiment of a method for monitoring capacitance of the DC bus capacitor of a power electronic converter of the present disclosure, for further illustrating the method for determining capacitance of the DC bus capacitor C of a power electronic converter 1002 as shown in FIG. 5.

As shown in FIG. 11, the method of the present embodiment includes a parameter measuring step 100'''''' and a capacitance calculating step 110'.

In the parameter measuring step 100'''''', by measuring an AC current $I_g$ flowing through the first terminal $T_1$, a voltage $V_c$ on the DC bus capacitor C, a current $I_o$ flowing through the fourth terminal $T_4$ and a voltage $V_o$ on the fourth terminal in the above parameter measuring step 100, the pulsating power magnitude $P_{mag}$ is:

$$\|(I_g * D * V_c - I_o * V_o)_{-2f}\|.$$

The calculating step 110' is the same as that described above, which will not be repeated.

How to measure the voltage $V_c$ on the DC bus capacitor C, the current $I_g$ flowing through the first terminal $T_1$, the voltage $V_o$ on the fourth terminal $T_4$, the DC current $I_o$ flowing through the fourth terminal $T_4$, the pulsating power magnitude $P_{mag}$ on the DC bus capacitor C, the maximum value $V_{cmax}$ of the voltage on the DC bus capacitor C, the minimum value $V_{cmin}$ of the voltage on the DC bus capacitor and the average value $V_{cmean}$ of the voltage on the DC bus capacitor is not limited by the present embodiment.

FIG. 12 is a flow chart of another embodiment of a method for monitoring capacitance of a DC bus capacitor of a power electronic converter of the present disclosure, for further illustrating the method for determining a capacitance of a DC bus capacitor C of a power electronic converter 1003 as shown in FIG. 7.

As shown in FIG. 12, the method of the present embodiment includes a parameter measuring step 100'''''' and a capacitance calculating step 110'.

In the parameter measuring step 100'''''', by measuring an AC current $I_g$ flowing through the first terminal $T_1$ and a voltage $V_c$ on the DC bus capacitor C in the above parameter measuring step 100, the pulsating power magnitude $P_{mag}$ is:

$$\|(I_g * D * V_c - I_o * V_o)_{-2f}\|.$$

The calculating step 110' is the same as that described above, which will not be repeated.

How to measure the voltage $V_c$ on the DC bus capacitor C, the current $I_g$ flowing through the first terminal $T_1$, the pulsating power magnitude $P_{mag}$ on the DC bus capacitor C, the maximum value $V_{cmax}$ of the voltage on the DC bus capacitor C, the minimum value $V_{cmin}$ of the voltage on the DC bus capacitor and the average value $V_{cmean}$ of the voltage on the DC bus capacitor is not limited by the present embodiment.

Figure 13:
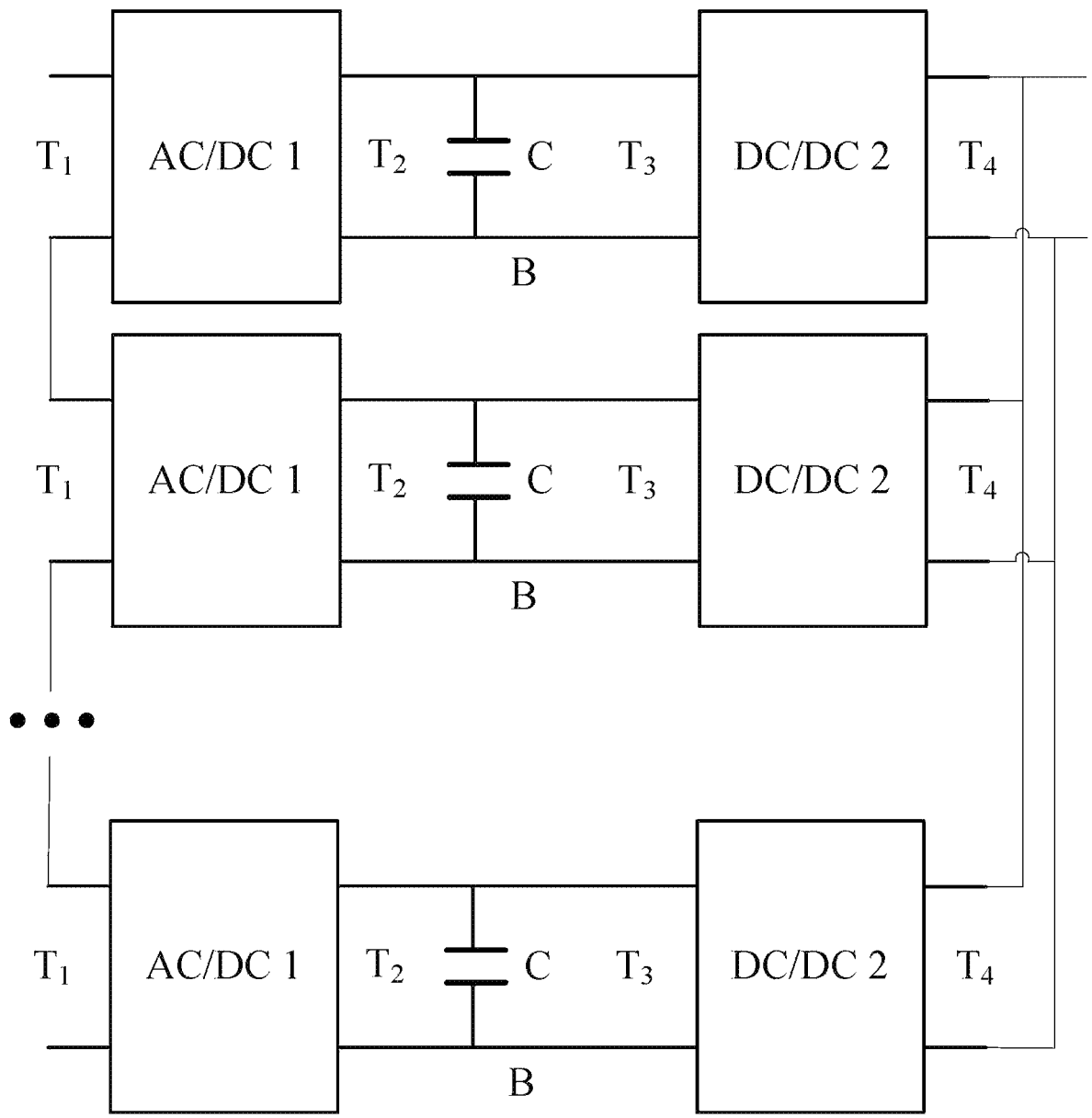
FIG. 13 is a schematic diagram of a plurality of power electronic converter modules of input-series-output-parallel.
Figure 14:
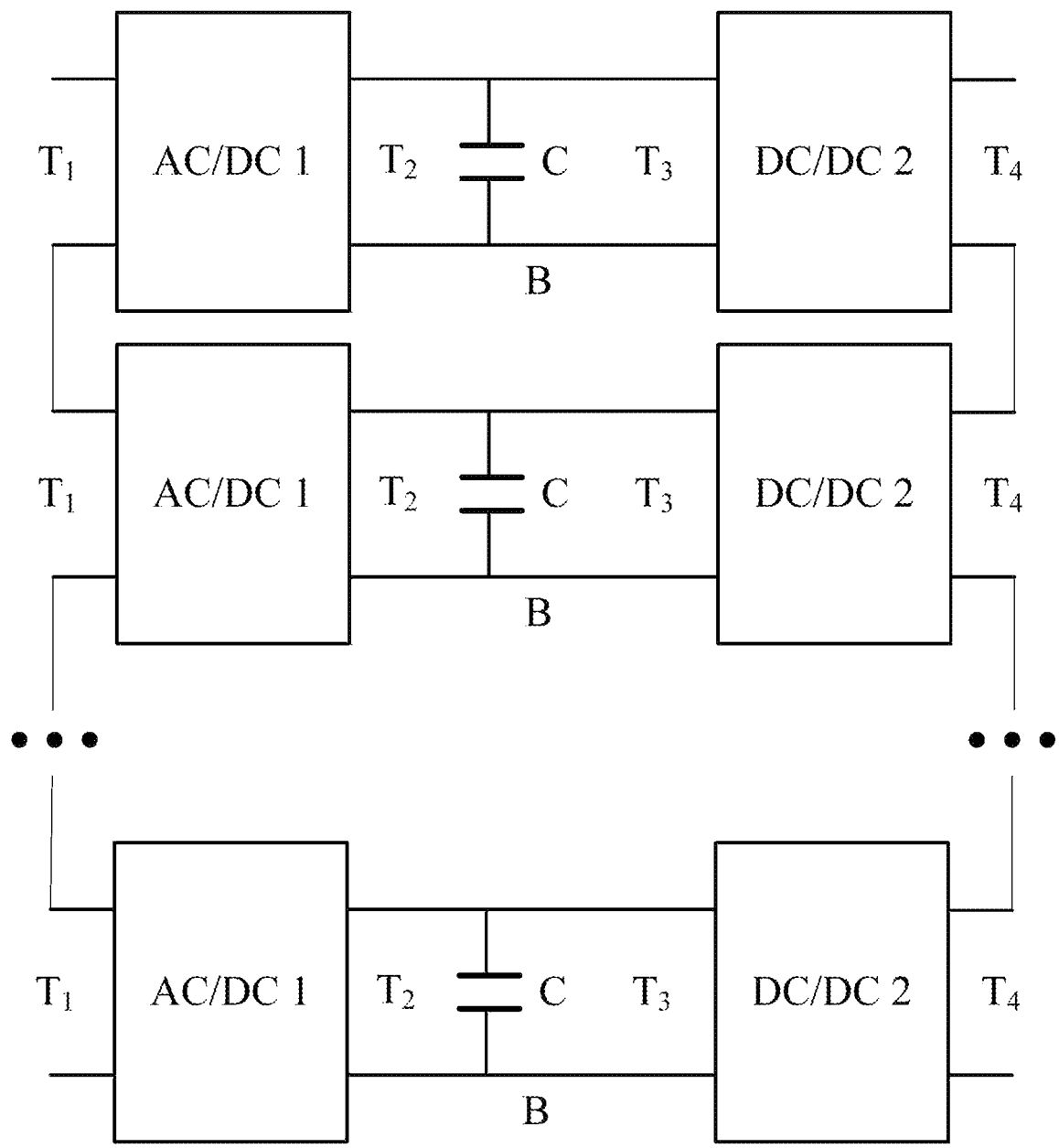
FIG. 14 is a schematic diagram of a plurality of power electronic converter modules of input-series-output-series.
Figure 15:
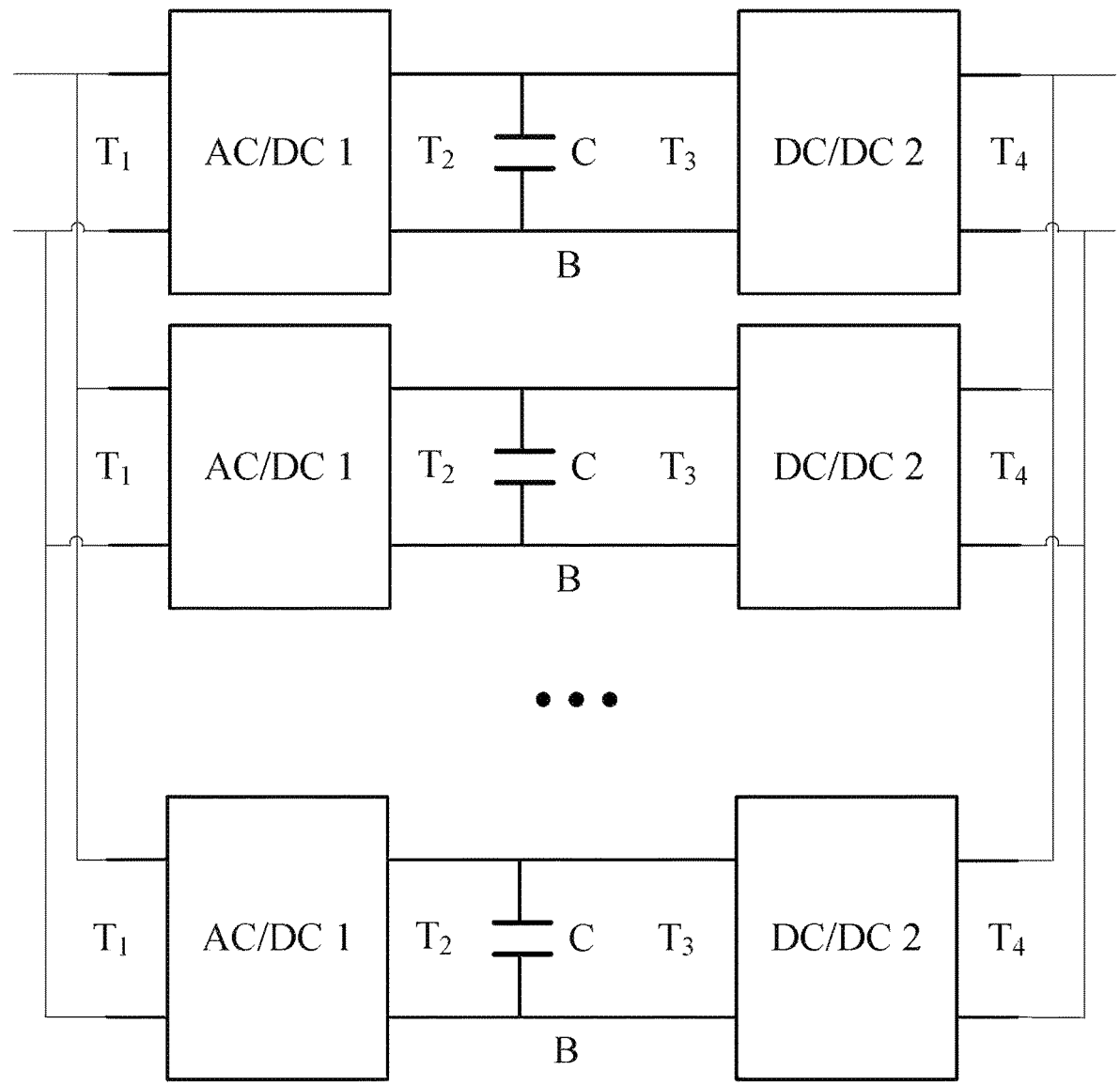
FIG. 15 is a schematic diagram of a plurality of power electronic converter modules of input-parallel-output-parallel.
Figure 16:
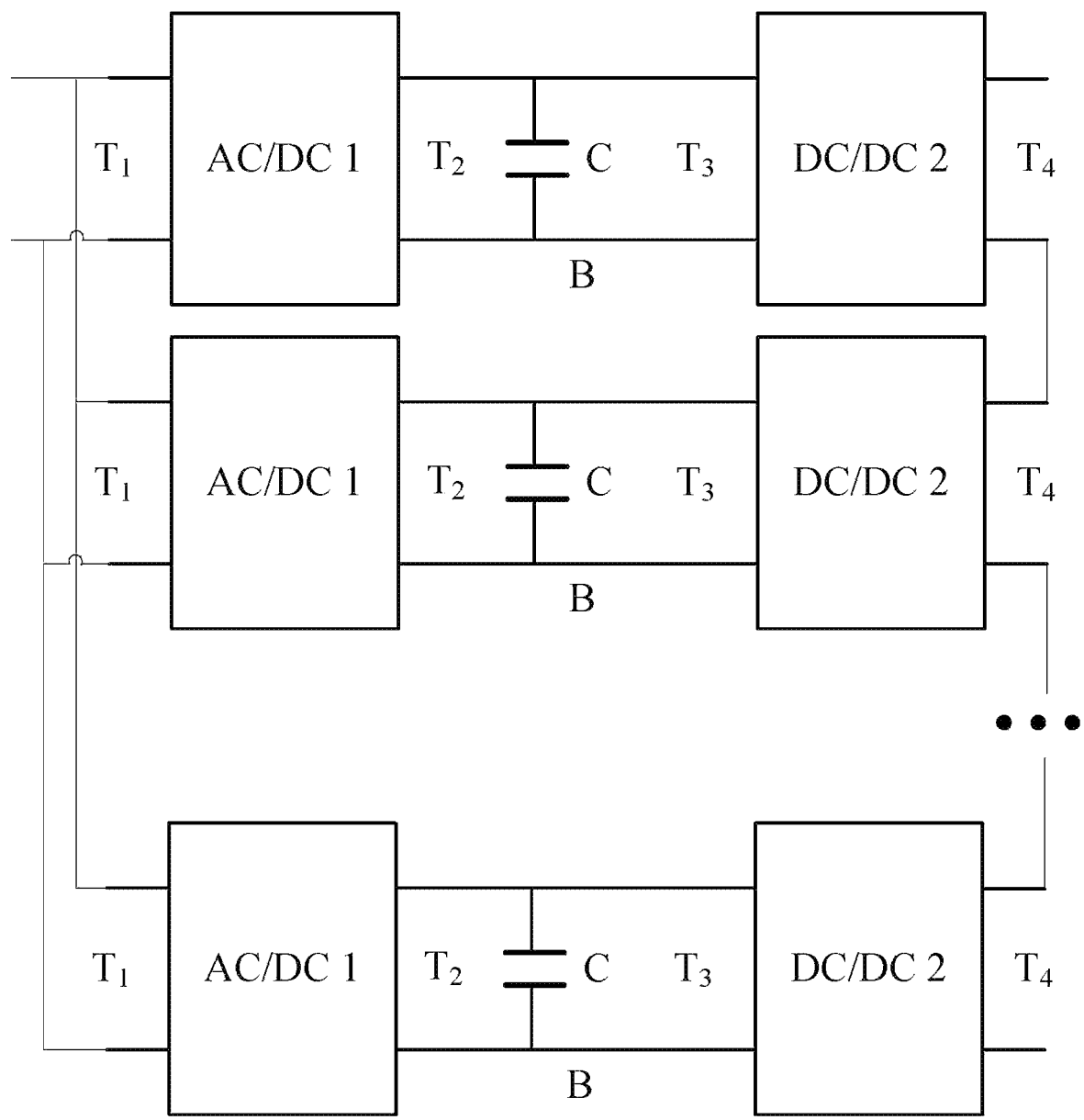
FIG. 16 is a schematic diagram of a plurality of power electronic converter modules of input-parallel-output-series.

The method for monitoring a capacitance of a DC bus capacitor of a power electronic converter of the present disclosure may be applied to a power electronic transformer system, a single-phase grid-connecting inverter system, a static var generator system and the like. In these systems, the number of the power electronic converters is more than one, and a connection relation of the power electronic converters is any one of input-series-output-series, input-series-output-parallel, input-parallel-output-series and input-parallel-output-parallel. The method for monitoring capacitance of a DC bus capacitor of a power electronic converter of the present disclosure is applicable to each power electronic converter. Such a system is shown in FIGS. 13-16, wherein each module structure is the power electronic converter 1002 as shown in FIG. 5. FIG. 13 is a schematic diagram of a plurality of power electronic converter modules of input-series-output-parallel. FIG. 14 is a schematic diagram of a plurality of power electronic converter modules of input-series-output-series. FIG. 15 is a schematic diagram of a plurality of power electronic converter modules of input-parallel-output-parallel. FIG. 16 is a schematic diagram of a plurality of power electronic converter modules of input-parallel-output-series.

Figure 17:
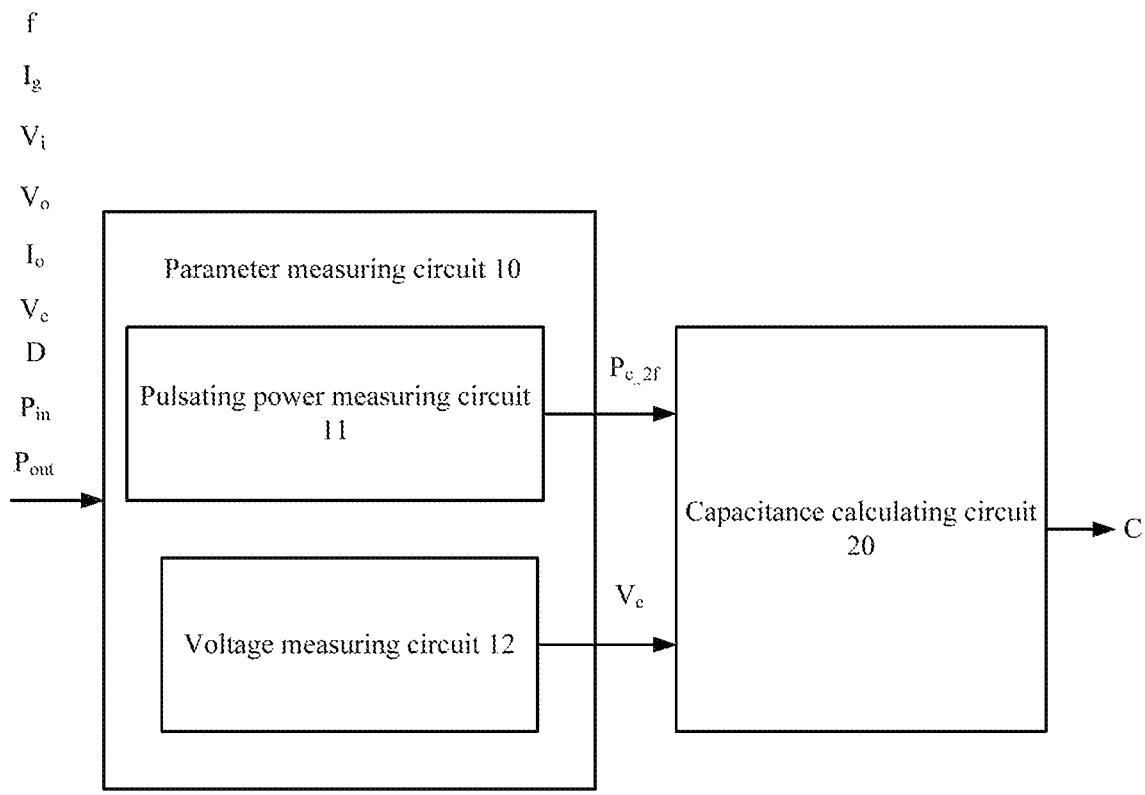
FIG. 17 is a schematic diagram of an apparatus 2000 for determining a capacitance of a DC bus capacitor C of the above-mentioned power electronic converters 1001-1003.

Corresponding to the above method for monitoring capacitance of a DC bus capacitor of a power electronic converter of the present disclosure, the present disclosure further provides an apparatus for monitoring a capacitance of a DC bus capacitor of a power electronic converter. FIG. 17 is a schematic diagram of an apparatus 2000 for determining a capacitance of a DC bus capacitor C of the above-mentioned power electronic converters 1001-1003.

As shown in FIG. 17, the apparatus 2000 for determining a capacitance of a DC bus capacitor C of the above-mentioned power electronic converters 1001-1003 includes:

a parameter measuring circuit 10, for performing the parameter measuring step 100 as shown in FIG. 3, including:

a pulsating power measuring circuit 11, configured to measure a pulsating power $P_{c\_2f}$ with a frequency of 2f flowing through the DC bus capacitor C; and a voltage measuring circuit 12, configured to measure a voltage $V_c$ on the DC bus capacitor C; and a capacitance calculating circuit 20, configured to perform the capacitance calculating step 110 as shown in FIG. 3.

Figure 18:
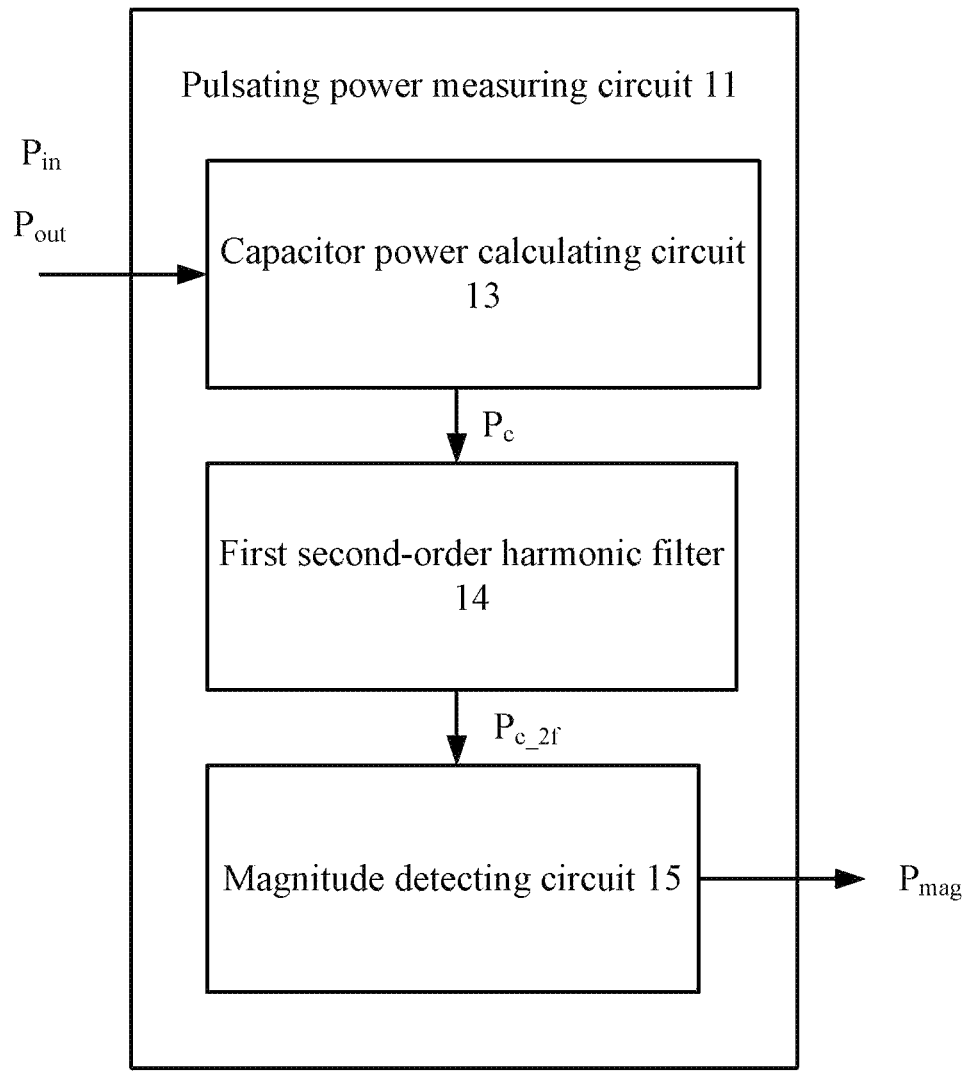
FIG. 18 is a schematic diagram illustrating a structure of the pulsating power measuring circuit 11 as shown in FIG. 17.

FIG. 18 is a schematic diagram illustrating a structure of the pulsating power measuring circuit 11 as shown in FIG. 17.

As shown in FIG. 18, the pulsating power measuring circuit 11 includes:

a capacitor power calculating circuit 13, configured to obtain a power $P_c$ of the DC bus capacitor, i.e., a power on the DC bus capacitor, according to a power $P_{in}$ input to a DC bus B and a power $P_{out}$ output from a DC bus B;

a first second-order harmonic filter 14, configured to filter out the pulsating power $P_{c\_2f}$ with a frequency of 2f from the power Pc; and a magnitude detecting circuit 15, configured to measure a magnitude $P_{mag}$ of the afore-mentioned pulsating power $P_{c\_2f}$.

Figure 19:
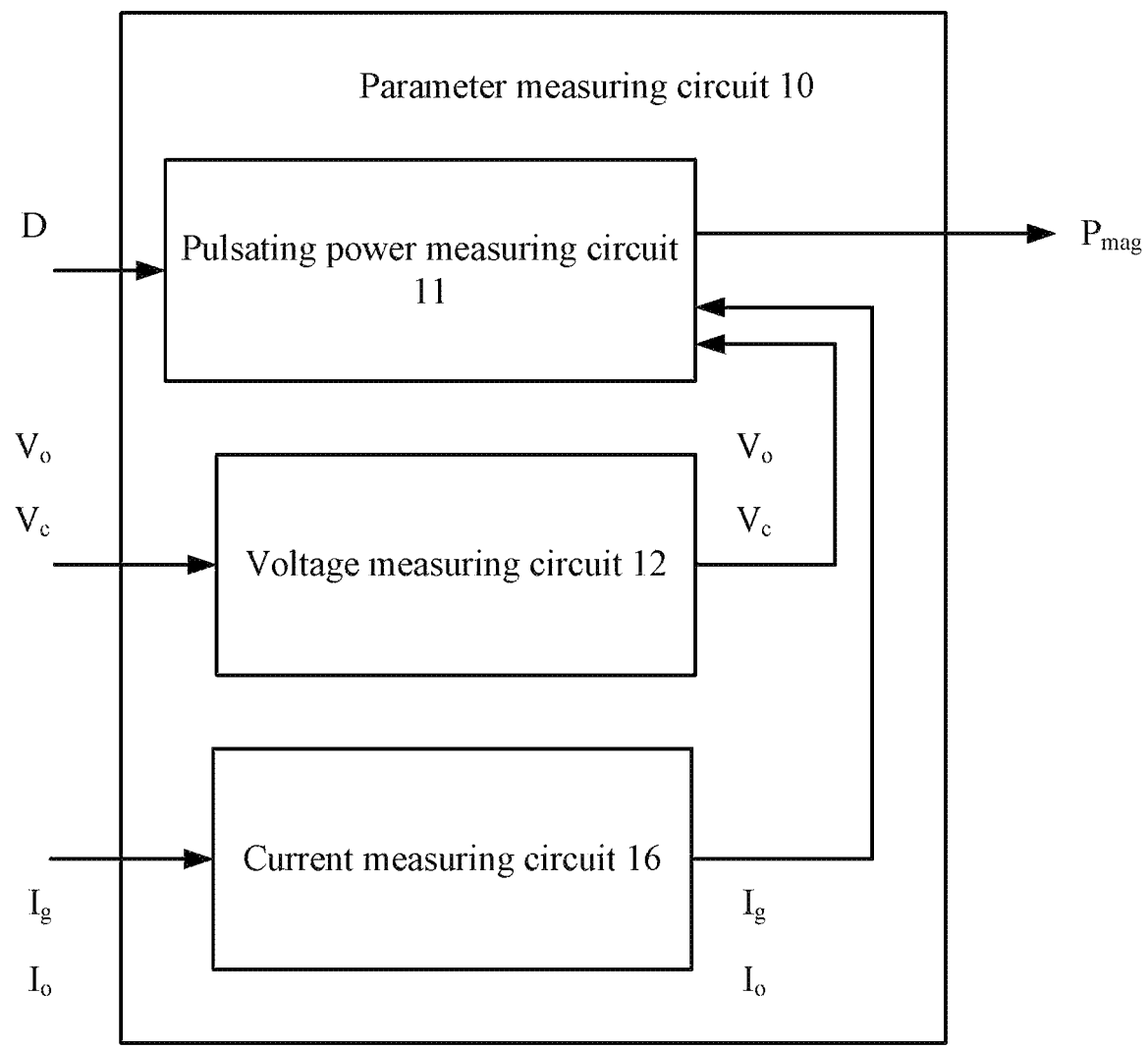
FIG. 19 is a schematic diagram further illustrating a structure of the parameter measuring circuit 10 as shown in FIG. 17.

FIG. 19 is a schematic diagram further illustrating a structure of the parameter measuring circuit 10 as shown in FIG. 17.

As shown in FIG. 19, the parameter measuring circuit 10 further includes:

a current measuring circuit 16, configured to measure an AC current $I_g$ flowing through the first terminal $T_1$ and a current $I_o$ flowing through the fourth terminal $T_4$, wherein the voltage measuring circuit 12 is configured to measure a voltage $V_o$ on the fourth terminal $T_4$.

Figure 20:
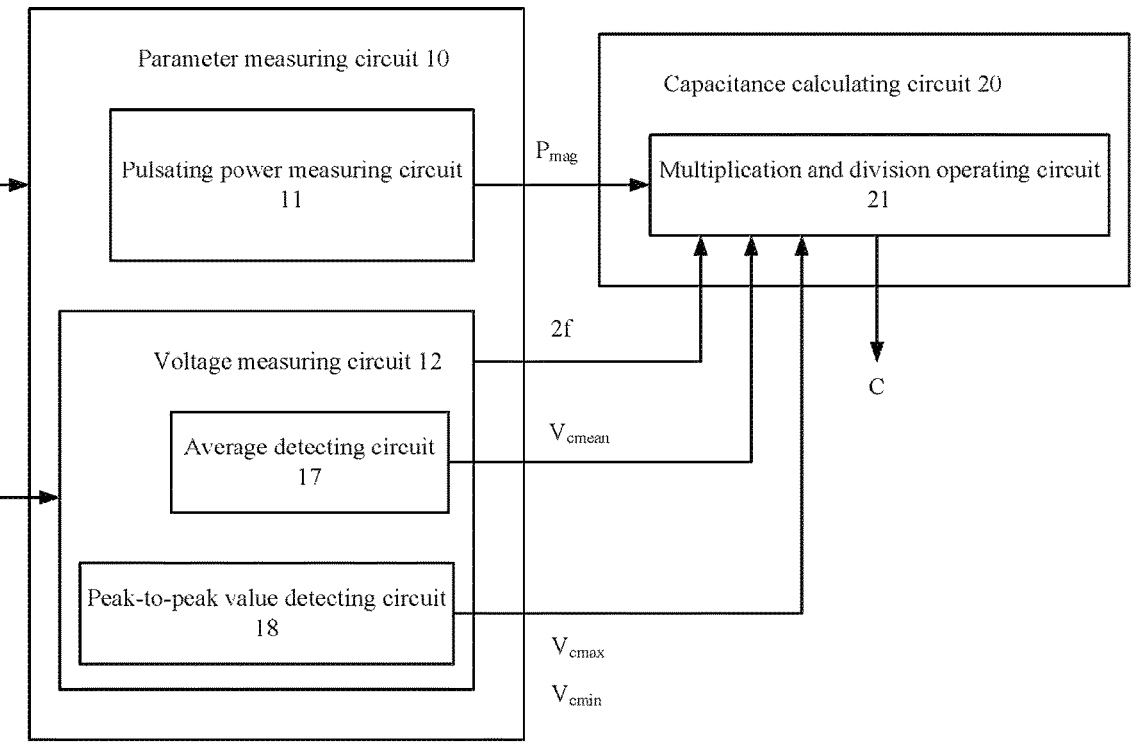
FIG. 20 is a schematic diagram of an apparatus 2001 for determining a capacitance of a DC bus capacitor C of the above-mentioned power electronic converters 1001-1003.

FIG. 20 is a schematic diagram of an apparatus 2001 for determining a capacitance of a DC bus capacitor C of the above-mentioned power electronic converters 1001-1003.

As shown in FIG. 20, the apparatus 2001 for determining a capacitance of a DC bus capacitor C of the above-mentioned power electronic converters 1001-1003 is on the basis of the apparatus 2000 in FIG. 17, wherein:

the voltage measuring circuit 12 includes:

an average detecting circuit 17, configured to measure the average value $V_{cmean}$ of the voltage on the DC bus capacitor C; and a peak-to-peak value detecting circuit 18, configured to measure the maximum value $V_{cmax}$ of the voltage on the DC bus capacitor C and the minimum value $V_{cmin}$ of the voltage on the DC bus capacitor C; and the capacitance calculating circuit 20 includes:

a multiplication and division operating circuit 21, configured to calculate the capacitance C of the DC bus capacitor C according to the average value $V_{cmean}$ of the voltage on the DC bus capacitor C, the maximum value $V_{cmax}$ of the voltage on the DC bus capacitor C, the minimum value $V_{cmin}$ of the voltage on the DC bus capacitor C and the pulsating power magnitude $P_{mag}$.

Figure 21:
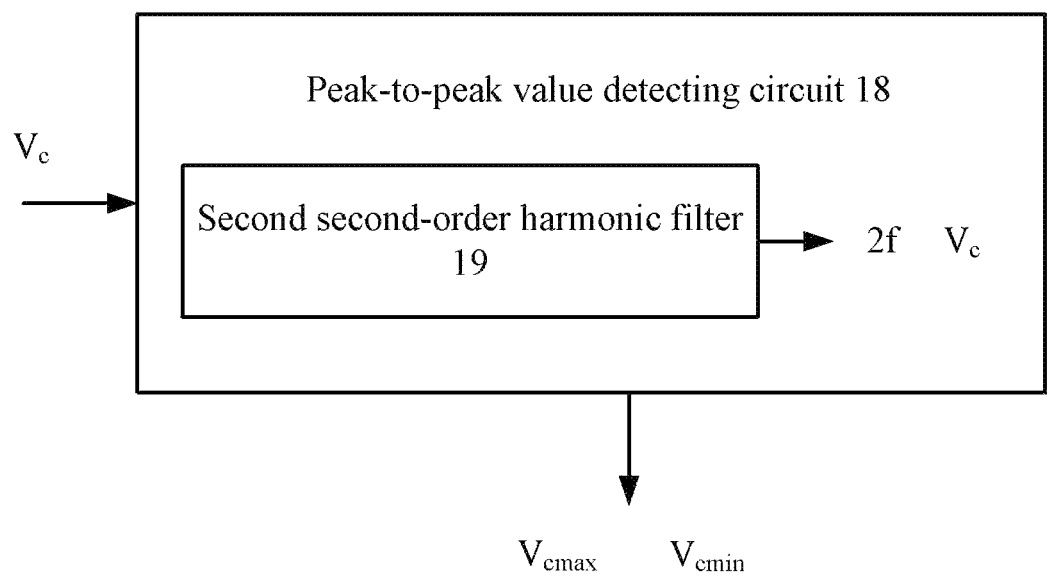
FIG. 21 is a schematic diagram illustrating a structure of the peak-to-peak value detecting circuit 18 as shown in FIG. 20.

FIG. 21 is a schematic diagram illustrating a structure of the peak-to-peak value detecting circuit 18 as shown in FIG. 20.

As shown in FIG. 21, the peak-to-peak value detecting circuit 18 includes:

a second second-order harmonic filter 19, configured to filter out a component $2f V_c$ with a frequency of 2f from the voltage $V_c$ on the DC bus capacitor C.

In the present disclosure, the maximum value $V_{cmax}$ of the voltage on the DC bus capacitor C and the minimum value $V_{cmin}$ of the voltage on the DC bus capacitor C are defined as a maximum and a minimum values of the component $2f V_c$ with a frequency of 2f.

Figure 22:
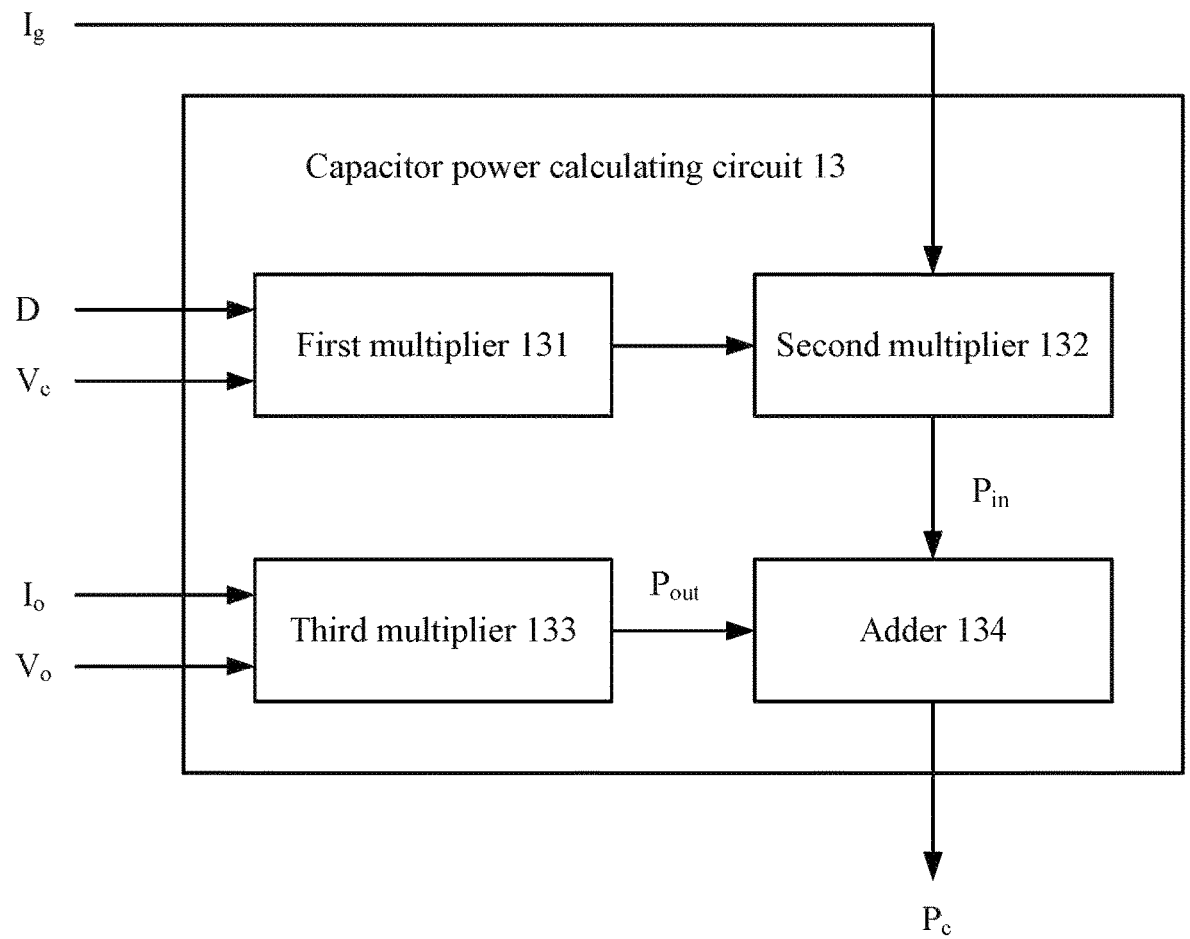
FIG. 22 is a schematic diagram for illustrating an embodiment of the capacitor power calculating circuit 13 in FIG. 18.

FIG. 22 is a schematic diagram for illustrating an embodiment of the capacitor power calculating circuit 13 in FIG. 18.

As shown in FIG. 22, the capacitor power calculating circuit 13 includes a first multiplier 131, a second multiplier 132, a third multiplier 133 and an adder 134. The first multiplier 131 multiplies the duty ratio D of the AC/DC 1 by the voltage $V_c$ on the DC bus capacitor C. The second multiplier 132 multiplies the above multiplied result by the current $I_g$ flowing through the first terminal $T_1$, to obtain the power $P_{in}$ input to the DC bus B. The third multiplier 133 multiplies the voltage $V_o$ on the fourth terminal $T_4$ by the current $I_o$ flowing through the fourth terminal $T_4$, to obtain the power $P_{out}$ output from the DC bus B. Then, the adder 134 subtracts the power $P_{in}$ input to the DC bus B by the power $P_{out}$ output from the DC bus B, to obtain the power $P_c$ of the DC bus capacitor C.

Figure 23:
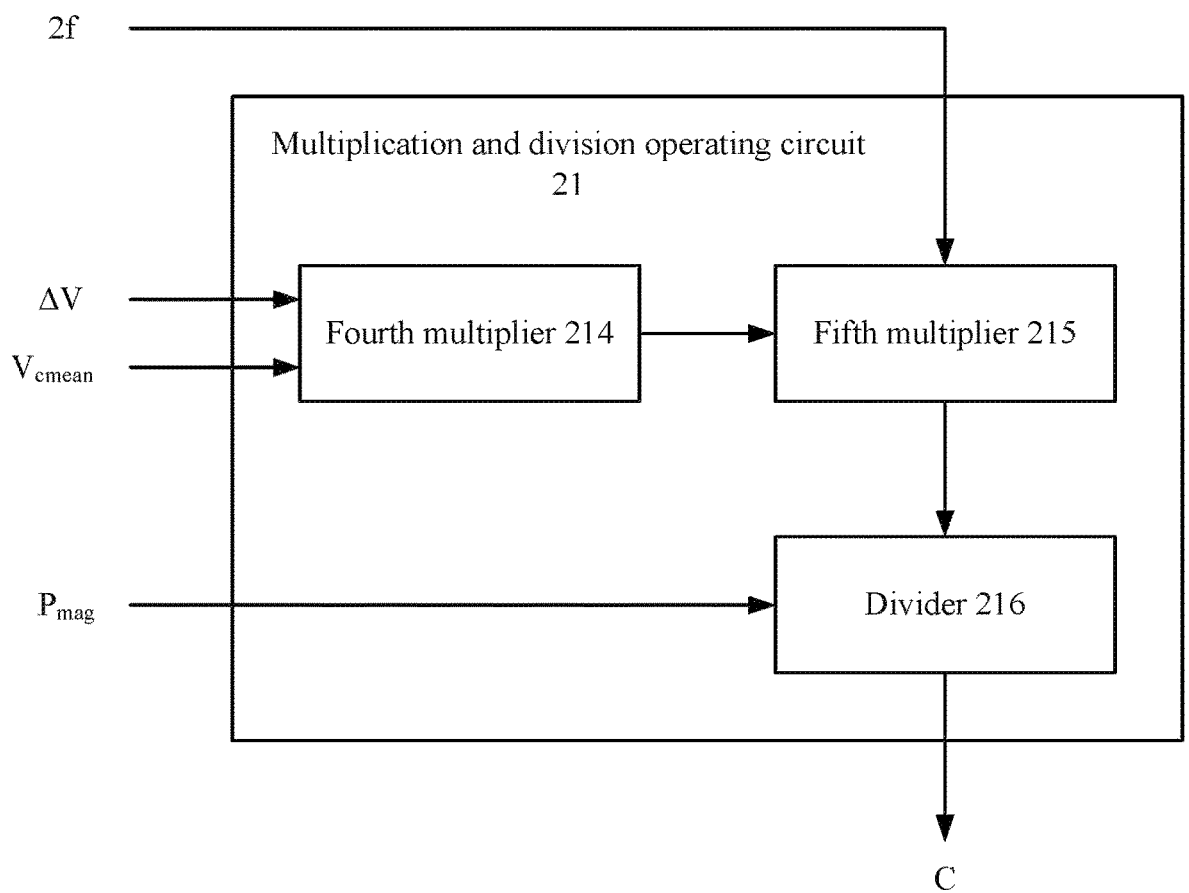
FIG. 23 is a schematic diagram of an embodiment of the multiplication and division operating circuit 21 of the capacitance calculating circuit 20 in the apparatus 2001 for determining a capacitance of a DC bus capacitor C of the above-mentioned power electronic converters 1001-1003 as shown in FIG. 20.

FIG. 23 is a schematic diagram of an embodiment of the multiplication and division operating circuit 21 of the capacitance calculating circuit 20 in the apparatus 2001 for determining a capacitance of a DC bus capacitor C of the above-mentioned power electronic converters 1001-1003 as shown in FIG. 20.

The multiplication and division operating circuit 21 as shown in FIG. 23 includes a fourth multiplier 214, a fifth multiplier 215 and a divider 216. The fourth multiplier 214 multiplies the difference $\Delta V$ between the maximum value $V_{cmax}$ of the voltage on the DC bus capacitor C and the minimum value $V_{cmin}$ of the voltage on the DC bus capacitor C by the average value $V_{cmean}$ of the voltage on the DC bus capacitor C. The fifth multiplier 215 multiplies the above multiplied result by the frequency of 2f. Then, the divider 216 divides the pulsating power amplitude $P_{mag}$ by the result obtained by the fifth multiplier 215, to obtain the capacitance C of the DC bus capacitor C.

Figure 25:
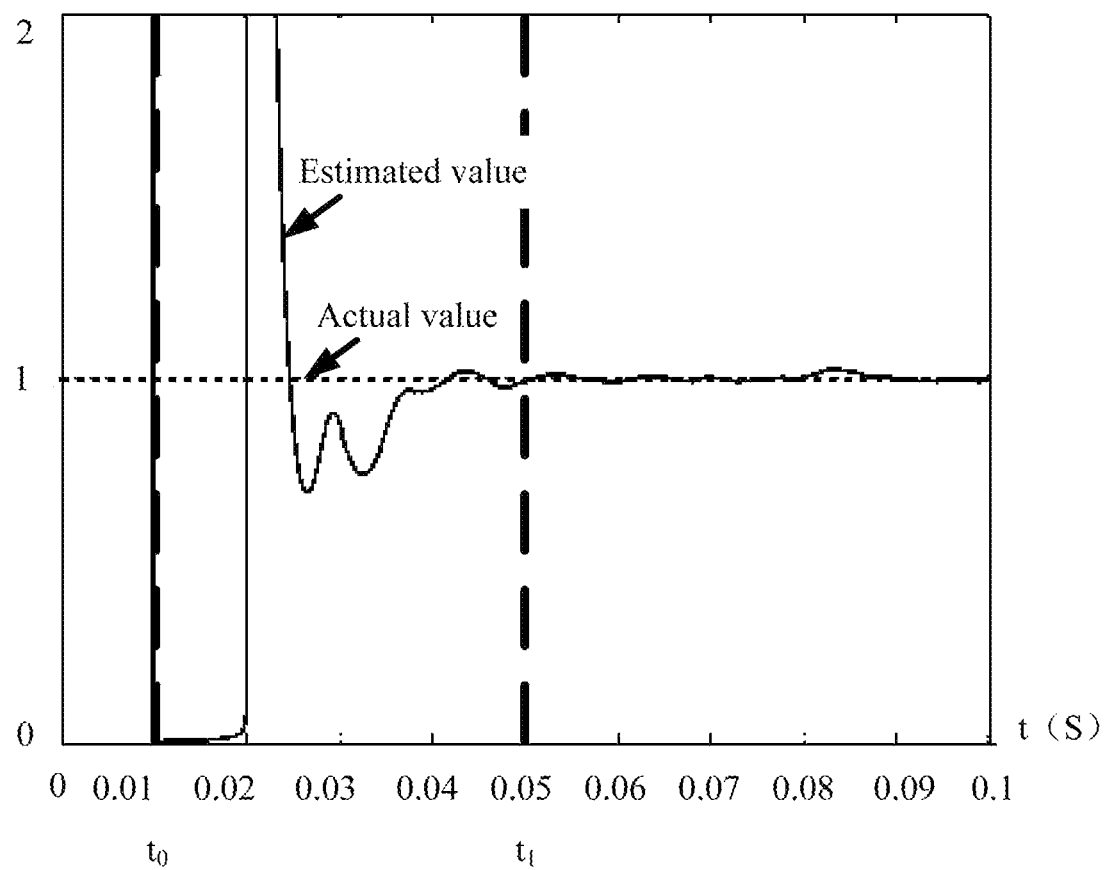
FIG. 25 is a simulation waveform diagram of a method and apparatus for monitoring a capacitance of a DC bus capacitor of a power electronic converter according to the present disclosure.

FIG. 25 is a simulation waveform diagram of a method and apparatus for monitoring capacitance of a DC bus capacitor of a power electronic converter according to the present disclosure. As shown in FIG. 25, the method of the present disclosure starts at time to and tends to be stable at time $t_1$, and this time length is determined by the average value filter, the low pass filter and the time constant of the low pass filter used in the algorithm. After stabilization, the estimated value of the capacitance of the DC bus capacitor may accurately converge to its actual value.

In view of the above, through the method and apparatus for monitoring a capacitance of a DC bus capacitor of a power electronic converter of the present disclosure, signals capable of reflecting a power of an AC side of the power electronic converter, signals capable of reflecting a power of a DC side of the power electronic converter and a voltage of the DC bus capacitor are received, to obtain a pulsating power and a pulsating voltage of the DC bus capacitor and calculate the capacitance thereof in an open loop mode.

Through the method and apparatus for monitoring capacitance of a DC bus capacitor of a power electronic converter according to the present disclosure, no additional hardware sampling and control circuit need to be added; the open loop estimation manner is simple and reliable, which avoids the stability problem brought by two feedback circuits in the prior art; the existing control architecture is not affected, which avoids the problem that the duty cycles of other modules need to be adjusted based on the output of the measured module in the existing technology scheme, and it is convenient to embed the apparatus into an existing control system as a separate functional module; and all DC bus capacitors in the power electronic converter modules may be estimated at the same time, and there is no need to specify a module to be measured by a selection signal.

The present disclosure has been described by the above-described related embodiments. However, the above-described embodiments are merely examples of the present application. It is to be noted that the disclosed embodiments do not limit the scope of the present disclosure. Rather, changes and modifications without departing from the spirit and scope of the present disclosure all belong to the patent protection of the present disclosure.

What is claimed is:

1. A method for monitoring a DC bus capacitor of a power electronic converter, wherein the power electronic converter comprises an AC/DC conversion circuit having a first terminal and a second terminal and the DC bus capacitor connected to the second terminal of the AC/DC conversion circuit, the first terminal is connected to an AC grid with a frequency of f, and the method comprises:

measuring an AC current flowing through the first terminal of the AC/DC conversion circuit and a voltage on the DC bus capacitor;

calculating a power of the DC bus capacitor at least according to the AC current flowing through the first terminal of the AC/DC conversion circuit, the voltage on the DC bus capacitor and a duty ratio of the AC/DC conversion circuit;

filtering out a pulsating power with a frequency of 2f from the power of the DC bus capacitor and obtaining a magnitude of the pulsating power; and calculating a capacitance of the DC bus capacitor based on the magnitude of the pulsating power and the voltage on the DC bus capacitor.

2. The method for monitoring a DC bus capacitor of a power electronic converter according to claim 1, wherein the power of the DC bus capacitor is calculated by a formula:

$$I_g*D*V_c,$$

wherein $I_g$ is the AC current flowing through the first terminal of the AC/DC conversion circuit, D is the duty ratio of the AC/DC conversion circuit, and $V_c$ is the voltage on the DC bus capacitor.

3. The method for monitoring a DC bus capacitor of a power electronic converter according to claim 1, wherein the capacitance of the DC bus capacitor is calculated by a formula:

$$P_{mag}/(2*\pi*f*(V_{cmax}-V_{cmin})*V_{cmean}),$$

wherein $P_{mag}$ is the magnitude of the pulsating power, $V_{cmax}$ is a maximum value of the voltage on the DC bus capacitor, $V_{cmin}$ is a minimum value of the voltage on the DC bus capacitor, and $V_{cmean}$ is an average value of the voltage on the DC bus capacitor.

4. The method for monitoring a DC bus capacitor of a power electronic converter according to claim 1, wherein the power electronic converter further comprises a DC/DC conversion circuit having a third terminal and a fourth terminal, the third terminal is connected to the DC bus capacitor, the fourth terminal is connected to a load, and the power of the DC bus capacitor is calculated by a formula:

$$I_g*D*V_c-I_o*V_o,$$

wherein $I_g$ is the AC current flowing through the first terminal of the AC/DC conversion circuit D is the duty ratio of the AC/DC conversion circuit, $V_c$ is the voltage on the DC bus capacitor, $I_o$ is a current flowing through the fourth terminal of the DC/DC conversion circuit, and $V_o$ is a voltage on the fourth terminal of the DC/DC conversion circuit.

5. An apparatus for monitoring a DC bus capacitor of a power electronic converter, wherein the power electronic converter comprises a AC/DC conversion circuit having a first terminal and a second terminal and the DC bus capacitor connected to the second terminal of the AC/DC conversion circuit, the first terminal is connected to an AC grid with a frequency of f, and the apparatus comprises:
 a voltage/current measuring circuit, configured to measure a voltage on the DC bus capacitor and an AC current flowing through the first terminal of the AC/DC conversion circuit;
 a capacitor power calculating circuit, configured to calculate a power of the DC bus capacitor at least according to the AC current flowing through the first terminal of the AC/DC conversion circuit, the voltage on the DC bus capacitor and a duty ratio of the AC/DC conversion circuit;
 a first second-order harmonic filter, configured to filter out a component with a frequency of 2f from the power of the DC bus capacitor to obtain a pulsating power;
 a magnitude detecting circuit, configured to obtain a magnitude of the pulsating power; and
 a capacitance calculating circuit, configured to calculate a capacitance of the DC bus capacitor based on the magnitude of the pulsating power and the voltage on the DC bus capacitor.

6. The apparatus for monitoring a DC bus capacitor of a power electronic converter according to claim 5, wherein the power of the DC bus capacitor is calculated by a formula, $$I_g*D*V_c,$$

wherein $I_g$ is the AC current flowing through the first terminal, D is the duty ratio of the AC/DC conversion circuit, and $V_c$ is the voltage on the DC bus capacitor.

7. The apparatus for monitoring a DC bus capacitor of a power electronic converter according to claim 5, wherein the voltage/current measuring circuit comprises:
 an average detecting circuit, configured to obtain an average value of the voltage on the DC bus capacitor; and
 a peak-to-peak value detecting circuit, configured to obtain a maximum value of the voltage on the DC bus capacitor and a minimum value of the voltage on the DC bus capacitor.

8. The apparatus for monitoring a DC bus capacitor of a power electronic converter according to claim 7, wherein the peak-to-peak value detecting circuit comprises:
 a second second-order harmonic filter, configured to filter out a component with a frequency of 2f from the voltage on the DC bus capacitor,
 wherein the maximum value of the voltage on the DC bus capacitor and the minimum value of the voltage on the DC bus capacitor are defined as a maximum and a minimum values of the component with a frequency of 2f, respectively.

9. The apparatus for monitoring a DC bus capacitor of a power electronic converter according to claim 7, wherein the capacitance of the DC bus capacitor is calculated by a formula:

$$P_{mag}/(2*\pi*f(V_{cmax}-V_{cmin})*V_{cmean}),$$

wherein $P_{mag}$ is the magnitude of the pulsating power, $V_{cmax}$ is the maximum value of the voltage on the DC bus capacitor, $V_{cmin}$ is the minimum value of the voltage on the DC bus capacitor, and $V_{cmean}$ is the average value of the voltage on the DC bus capacitor.

10. The apparatus for monitoring a DC bus capacitor of a power electronic converter according to claim 5, wherein a number of the power electronic converters is more than one, inputs of the plural power electronic converters are connected in series or parallel, and outputs of the plural power electronic converters are connected in series or parallel.

11. The apparatus for monitoring a DC bus capacitor of a power electronic converter according to claim 5, wherein the power electronic converter further comprises a DC/DC conversion circuit having a third terminal and a fourth terminal, the third terminal is connected to the DC bus capacitor the fourth terminal is connected to a load, and the power of the DC bus capacitor is calculated by a formula:

$$I_g*D*V_c-I_o*V_o,$$

wherein $I_g$ is the AC current flowing through the first terminal, D is the duty ratio of the AC/DC conversion circuit, $V_c$ is the voltage on the DC bus capacitor, $I_o$ is a current flowing through the fourth terminal, and $V_o$ is a voltage on the fourth terminal.

12. The apparatus for monitoring a DC bus capacitor of a power electronic converter according to claim 7, wherein the capacitance calculating circuit comprises:
 an operating circuit, configured to calculate the capacitance of the DC bus capacitor according to the average value of the voltage on the DC bus capacitor, the maximum value of the voltage on the DC bus capacitor, the minimum value of the voltage on the DC bus capacitor and the pulsating power magnitude.

* * * * *